(12) United States Patent
Delgado et al.

(10) Patent No.: US 10,714,295 B2
(45) Date of Patent: Jul. 14, 2020

(54) METAL ENCAPSULATED PHOTOCATHODE ELECTRON EMITTER

(71) Applicant: KLA-TENCOR CORPORATION, Milpitas, CA (US)

(72) Inventors: Gildardo R. Delgado, Livermore, CA (US); Katerina Ioakeimidi, San Francisco, CA (US); Frances Hill, Sunnyvale, CA (US); Gary V. Lopez Lopez, Sunnyvale, CA (US); Rudy F. Garcia, Union City, CA (US)

(73) Assignee: KLA-Tencor Corporation, Milpitas, CA (US)

(*) Notice: Subject to any disclaimer, the term of this patent is extended or adjusted under 35 U.S.C. 154(b) by 0 days.

(21) Appl. No.: 16/259,317

(22) Filed: Jan. 28, 2019

(65) Prior Publication Data
US 2020/0090895 A1    Mar. 19, 2020

Related U.S. Application Data

(60) Provisional application No. 62/732,937, filed on Sep. 18, 2018.

(51) Int. Cl.
*H01J 40/06* (2006.01)
*H01J 1/34* (2006.01)
*H01J 37/28* (2006.01)

(52) U.S. Cl.
CPC .......... *H01J 1/34* (2013.01); *H01J 37/28* (2013.01); *H01J 2201/3423* (2013.01); *H01J 2201/3425* (2013.01); *H01J 2201/3426* (2013.01); *H01J 2237/022* (2013.01); *H01J 2237/06333* (2013.01); *H01J 2237/28* (2013.01)

(58) Field of Classification Search
None
See application file for complete search history.

(56) References Cited

U.S. PATENT DOCUMENTS

| | | | | |
|---|---|---|---|---|
| 3,706,885 A | * | 12/1972 | Fister | G21K 4/00 250/459.1 |
| 4,008,106 A | * | 2/1977 | Gutierrez | H01J 9/12 438/20 |
| 10,395,884 B2 | * | 8/2019 | Delgado | H01J 37/28 |
| 2004/0140432 A1 | | 7/2004 | Maldonado et al. | |
| 2010/0025796 A1 | | 2/2010 | Dabiran | |
| 2018/0174794 A1 | | 6/2018 | Delgado et al. | |
| 2019/0108966 A1 | | 4/2019 | Delgado et al. | |

FOREIGN PATENT DOCUMENTS

| | | |
|---|---|---|
| CN | 104561901 A | 4/2015 |
| EP | 1019942 B1 | 5/2006 |
| WO | 2013090261 A1 | 6/2013 |

OTHER PUBLICATIONS

WIPO, ISR for PCT/US2019/051372, dated Feb. 13, 2020.

* cited by examiner

*Primary Examiner* — Vip Patel
(74) *Attorney, Agent, or Firm* — Hodgson Russ LLP (57) ABSTRACT

A photocathode structure, which can include one or more of $Cs_2Te$, CsKTe, CsI, CsBr, GaAs, GaN, InSb, CsKSb, or a metal, has a protective film on an exterior surface. The protective film includes one or more of ruthenium, nickel, platinum, chromium, copper, gold, silver, aluminum, or an alloy thereof. The protective film can have a thickness from 1 nm to 10 nm. The photocathode structure can be used in an electron beam tool like a scanning electron microscope.

19 Claims, 5 Drawing Sheets

METAL ENCAPSULATED PHOTOCATHODE ELECTRON EMITTER

CROSS-REFERENCE TO RELATED APPLICATIONS

This application claims priority to the provisional patent application filed Sep. 18, 2018 and assigned U.S. App. No. 62/732,937, the disclosure of which is hereby incorporated by reference.

FIELD OF THE DISCLOSURE

This disclosure relates to protective films for electron emitters.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Electron beams are used in a number of different applications during semiconductor manufacturing. For example, electron beams can be modulated and directed onto an electron-sensitive resist on a semiconductor wafer, mask, or other workpiece to generate an electron pattern on the workpiece. Electron beams also can be used to inspect a wafer by, for example, detecting electrons emerging or reflected from the wafer to detect defects, anomalies, or undesirable objects.

These inspection processes are used at various steps during a semiconductor manufacturing process to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Photocathodes also have been used to generate electron beams. A single light beam incident on a photocathode system can generate a single electron beam with high brightness that is capable of delivering high electron current density. For example, alkali-based photo electron emitters have been used as photocathode emitters in the UV spectral range. These photocathodes deteriorate due to vacuum environment and exposure to heavy deep ultraviolet (DUV) photons. There is no clear method to prevent this from occurring over the system lifetime.

Photocathode electron emitters generally do not have a protective coating to protect them from oxidation or carbon build up from the vacuum environment. Some have a protective cap layer, but existing protective cap layers on photocathodes are not robust to cleaning. Therefore, these cap layers cannot protect a photocathode electron emitter during operation.

Therefore, improved photocathode electron emitters are needed.

BRIEF SUMMARY OF THE DISCLOSURE

An electron emitter is provided in a first embodiment. The electron emitter comprises a photocathode structure that includes a photocathode structure that includes one or more of Cs2Te, CsKTe, CsI, CsBr, GaAs, GaN, InSb, CsKSb, or a metal and a protective film disposed on an exterior surface of the photocathode structure. The protective film includes one or more of ruthenium, nickel, platinum, chromium, copper, gold, silver, aluminum, or an alloy thereof.

In an instance, a voltage source applies a voltage to the protective film.

The electron emitter can further include a substrate and a second protective film between the substrate and the photocathode structure. The second protective film can include one or more of ruthenium, nickel, platinum, chromium, copper, gold, silver, aluminum, or an alloy thereof. In an instance, the second protective film includes one or more of ruthenium, nickel, or platinum. The substrate can be one or more of quartz, sapphire, UV fused silica, $CaF_2$, or $MgF_2$.

The electron emitter can further include a substrate disposed on an opposite side of the photocathode structure from the exterior surface. The protective film can encapsulate the photocathode structure and is disposed between the photocathode structure and the substrate. The substrate can be one or more of quartz, sapphire, UV fused silica, $CaF_2$, or $MgF_2$. A voltage source can apply a voltage to the protective film.

In an instance, the photocathode structure includes $Cs_2Te$ or CsKTe and the protective film includes one or more of ruthenium, nickel, or platinum.

In an instance, the protective film includes nickel.

The photocathode structure can be configured to operate in transmission or reflection mode.

The protective film can be transparent to UV wavelengths.

The protective film can have a thickness from 1 nm to 10 nm.

The protective film can have a porosity less than or equal to 25%.

The protective film can have a packing density of greater than or equal to 0.92.

An electron beam tool can include an instance of the electron emitter of the first embodiment. The electron beam tool includes a detector that receives electrons generated by the electron emitter and reflected from a surface of a wafer.

A method is provided in a second embodiment. A photocathode structure that includes one or more of $Cs_2Te$, CsKTe, CsI, CsBr, GaAs, GaN, InSb, CsKSb, or a metal is provided. A protective film is deposited on an exterior surface of the photocathode structure. The protective film includes one or more of ruthenium, nickel, platinum, chromium, copper, gold, silver, aluminum, or an alloy thereof. Depositing can include ion sputtering, magnetron sputtering, or atomic layer deposition.

A method is provided in a third embodiment. A photocathode structure is provided. The photocathode includes one or more of $Cs_2Te$, CsKTe, CsI, CsBr, GaAs, GaN, InSb, CsKSb, or a metal and a protective film disposed on an exterior surface of the photocathode structure. The protective film includes one or more of ruthenium, nickel, platinum, chromium, copper, gold, silver, aluminum, or an alloy thereof. An electron beam is generated from the photocathode structure when photons are directed at the photocathode structure.

A plasma clean of the photocathode structure can be performed.

The photocathode structure can generate the electron beam in transmission mode or reflection mode.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

High quantum efficiency photocathodes that can operate in lower vacuum conditions are disclosed. Ruthenium, ruthenium alloys, platinum, platinum alloys, nickel, nickel alloys, chromium, chromium alloys, copper, copper alloys, combinations thereof, or other metals can be used in a protective film to encapsulate one or more surfaces of a photocathode. These other metals can be, for example, gold, silver, or aluminum. Photocathodes are affected by vacuum conditions that can cause deterioration in field emission performance. To maintain high electron current stability and lifetime, the photocathode can be wholly or partly encapsulated with the protective film. The protective film renders the photocathode resistant to oxidation and carbon build up. The protective film also has a relative low sputter yields and can withstand erosion by ions. Additionally, the protective film may provide advantages over using the photocathode by itself. Metals also can have lower emittance than semiconductors and insulators. Thus, use of the protective film may provide higher current stability due to the properties of the metal or metals, provide improved lifetime, provide lower emittance, and can enable operation at lower vacuum. Low emittance may be beneficial when focusing an electron beam to a small spot.

Photocathodes are electron sources that emit electrons when a photocathode structure is exposed to a source of light, either in transmission or reflection mode. The photocathode structure can be a bulk material, a film, or series of films deposited on a substrate. The wavelength(s) of the light can be selected to optimize the amount of emission currents and energy spread of the emitted electrons. The current produced by photocathodes may be more stable than the current produced by cold field emitters. Many materials can be used for photoemission, including silicon, silicon with a metal coating, or an alkali halide. For example, $Cs_2Te$ and CsKTe photocathodes have high quantum efficiency with light in a DUV range. Other photocathode materials that can be used include CsI, CsBr, GaAs, GaN, InSb, CsKSb, or metals. Other photocathode materials are possible.

Figure 1:
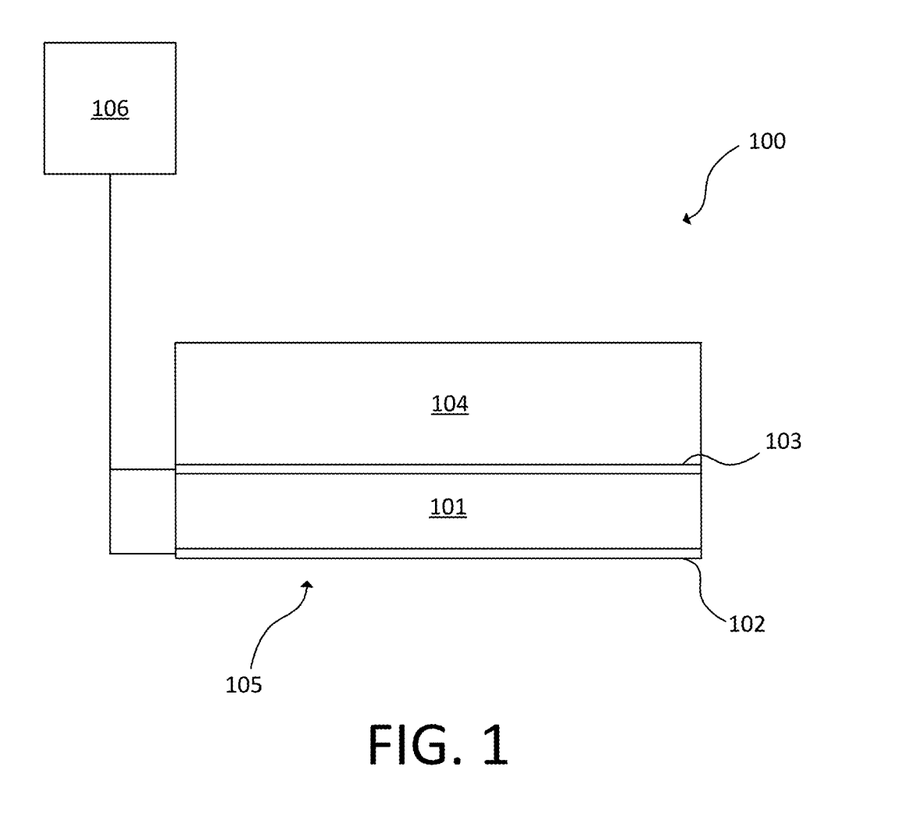
FIG. 1 is a cross-sectional diagram of an embodiment of an electron emitter in accordance with the present disclosure.

FIG. 1 is a cross-sectional diagram of an embodiment of an electron emitter 100. The electron emitter 100 includes a photocathode structure 101. The photocathode structure 101 can include $Cs_2Te$ and CsKTe. The photocathode structure 101 also can include other semiconductor or metallic photocathode materials. The photocathode structure 101 may include planar features, but other shapes are possible.

A protective film 102 is disposed on an exterior surface 105 of the photocathode structure 101. The protective film 102 includes one or more of ruthenium, nickel, platinum, chromium, copper, gold, silver, aluminum, or alloys thereof. For example, the protective film 102 may be ruthenium or a ruthenium alloy, such as an alloy of ruthenium and platinum. The protective film 102 makes the photocathode structure 101 more robust in the presence of high electric films and more robust to ion sputtering, plasma, or other cleaning techniques.

Under ultra-high vacuum conditions, a carbon layer can grow on surfaces of the electron emitter 100 during electron beam emission. Likewise, oxidation of surfaces of the electron emitter 100 occurs over time, even in ultra-high vacuum conditions. Carbon or oxidation can affect photocathode performance. The protective film 102 can protect surfaces of the electron emitter, such as the exterior surface 105 of the photocathode structure 101, from oxidation and carbon build up. This is beneficial to the lifetime of the electron emitter 100.

The electron emitter 100 can further include a substrate 104. The substrate 104 can be one or more of quartz, sapphire, UV fused silica, $CaF_2$, or $MgF_2$. Other materials for the substrate are possible.

In an instance, a 5 μm nickel protective film 102 is used with the photocathode structure 101.

A second protective film 103 may be formed between the substrate 104 and the photocathode structure 101. The second protective film 103 may be on an opposite surface of the photocathode structure 101 as the protective film 102. The second protective film 103 includes one or more of ruthenium, nickel, platinum, chromium, copper, gold, silver, aluminum, or alloys thereof. For example, the second protective film 103 may be ruthenium or a ruthenium alloy, such as an alloy of ruthenium and platinum.

The second protective film 103 may be different than the protective film 102. In an instance, the second protective film 103 may be a material that has low absorption with acceptable coverage, electrical uniformity, and plasmonic effects. The protective film 102 may have a lower work function than the second protective film 103.

In an instance, the protective film 102 and second protective film 103 are part of the same protective film that partly or fully encapsulates the photocathode structure 101. The substrate 104 is disposed on an opposite side of the photocathode structure 101 from the exterior surface 105. The protective film with the second protective film 103 is disposed between the photocathode structure 101 and substrate 104.

A voltage source 106 can apply a voltage to the protective film 102 or second protective film 103. Introducing voltage to the protective film 102 and/or second protective film 103 can provide control of electron migration to a desired surface. For example, if the second protective film 103 on the back side of the electron emitter 100 is positively charged, electrons can be made to migrate to the exit surface to enhance electron emission.

The protective film 102 or second protective film 103 can have a thickness from 1 nm to 10 nm, including all values to the 0.1 nm and ranges in between. This thickness can be measured from an outer surface of the photocathode structure 101 or another layer that the protective film 102 or second protective film 103 is disposed on. The optimal thickness of the protective film 102 can be configured for optimal electron emission. Larger thicknesses, while feasible, may affect efficiency.

The thickness of the protective film 102 may depend on the electron emitter 100 extractor configuration and wavelength used for photo electron emission. For example, the thickness may change by a value from 1-2 mm based on the electron emitter 100 extractor configuration. If the thickness is too large, then it will absorb all the light and/or will not allow electrons to escape easily due to the increased work function. As the protective film 102 generally provides a protective function, it can be thick enough to protect the photocathode structure 101 without affecting performance. The protective film 102 also can supply electrons, so the thickness can vary with the wavelength of light used for electron generation. For example, the thickness of the protective film 102 may be optimized for a 266 nm wavelength such that work function is minimized and coverage on the surface is uniform.

The thickness of the substrate 104 also may be optimized for a particular wavelength. The thickness of the substrate 104 can be selected to optimize electrical continuity while minimizing absorption of light.

The thickness of the protective film 102 also can be configured to optimize for best light transmission and for maximum quantum efficiency for given wavelength to produce optimal electron emission. As the thickness of the protective film 102 increases, it becomes more difficult for an electron to escape to vacuum so the quantum efficiency decreases. The exact thickness may depend on photocathode extractor configuration and wavelength used for photo electron emission. Optimizing the wavelength can minimize energy spread.

The protective film 102 may be free of pinholes in at least an emitting area of the photocathode structure 101. The second protective film 103 also may be free of pinholes. The protective film 102 or second protective film 103 can have a porosity less than or equal to 25%. Protection may be compromised if the porosity is greater than 25%. The protective film 102 or second protective film 103 can have a packing density of greater than or equal to 0.92. Protection may be compromised with a packing density less than 0.92. The properties of the protective film 102 may be different than that of the second protective film 103.

The protective film 102 or second protective film 103 can be deposited by ion or magnetron sputtering, atomic layer deposition (ALD), or by other methods that provide a dense, pinhole-free, uniform protective film 102. Porosity (P) can be defined and measured using index of refraction with the following equation.

$$P = \left[1 - \left(\frac{n_f^2 - 1}{n_{b-1}^2}\right) \times 100\%\right]$$

In the previous equation, $n_f$ is the refractive index of the protective film 102 and $n_b$ is the refractive index of the material. The packing density (PD) of a film is defined as the ratio of the average film density ($\rho_f$) and the bulk density ($\rho_B$) using the following equation.

$$PD = \rho_f/\rho_B$$

The correlation between the film refractive index and its packing density can be expressed with the following equation.

$$PD = \frac{(n_f^2 - 1)x(n_b^2 + 2)}{(n_f^2 + 2)x(n_b^2 - 1)}$$

The protective film 102 may be free of bubbles and inclusions in at least an emitting area. The second protective film 103 also may be free of bubbles and inclusions. For example, the protective film 102 or second protective film 103 may include imperfections only with a diameter or length dimension less than 1 nm.

The protective film 102 may have fewer than $10^4$ impurities over an emitting area. The impurities can include carbon, oxides, oxygen as a dissolved gas, sodium, or potassium.

The protective film 102 can be robust for electron field emission, robust in the presence of high electric fields, robust to ion sputtering, and robust to plasma or other cleaning methods. Oxidation and/or carbon can be removed from the protective film 102 without damaging the protective film 102. For example, the protective film 102 can be cleaned to atomic levels by molecular hydrogen, hydrogen plasmas, or other plasmas.

Besides allowing cleaning without damaging the protective film 102, the protective film 102 also can be resistant to oxidation and carbon contamination. Ruthenium may have the ability to break apart gas molecules that land on its surface or prevent adherence of such gas molecules to its surface. These molecules are capable of distorting the extraction field on the surface of the electron emitter 100 and causing enhanced emission which translates as noise in the beam because of the mobility and residence time of the molecule on the surface. Thus, the protective film 102 can be self-cleaning.

A photocathode structure 101 can have smoother surfaces and lower emittance if coated with the protective film 102. The protective film 102 on the photocathode structure 101 can control electromigration to a desired surface, such as during application of a voltage. Electromigration can be controlled with the protective film 102 on one surface of the photocathode structure 101 and the second protective film 103 on an opposite surface of the photocathode structure 101. The protective film 102 also may provide improved angular spread of the electron beam. A smoother protective film 102 can provide this improved angular spread.

Use of the protective film 102 can enable operation of the electron emitter 100 at a higher pressure. Photocathodes generally can operate at approximately $10^{-11}$ Torr. With a protective film 102, the electron emitter 100 may be able to operate at approximately $10^{-9}$ Torr.

The protective film 102 is transparent to UV wavelengths. This can enable operation of the electron emitter 100 in both transmission and reflection modes. Transmission mode illuminates a surface of the photocathode structure 101 opposite the exterior surface 105, such as through the substrate 104. Reflection mode illuminates the exterior surface 105 of the photocathode structure 101.

Embodiments of the electron source 100 can be used as the electron source in reticle and wafer inspection systems. For example, embodiments of the electron source 100 can be used as the electron source in electron beam wafer or reticle inspection systems using single or multiple electron sources, electron beam wafer or reticle review systems using single or multiple electron sources, or electron beam wafer or reticle metrology systems using single or multiple electron sources. Embodiments of the electron source 100 also can be used in systems that generate x-rays using single or multiple electron sources in wafer or reticle metrology, review, or inspection.

Figure 2:
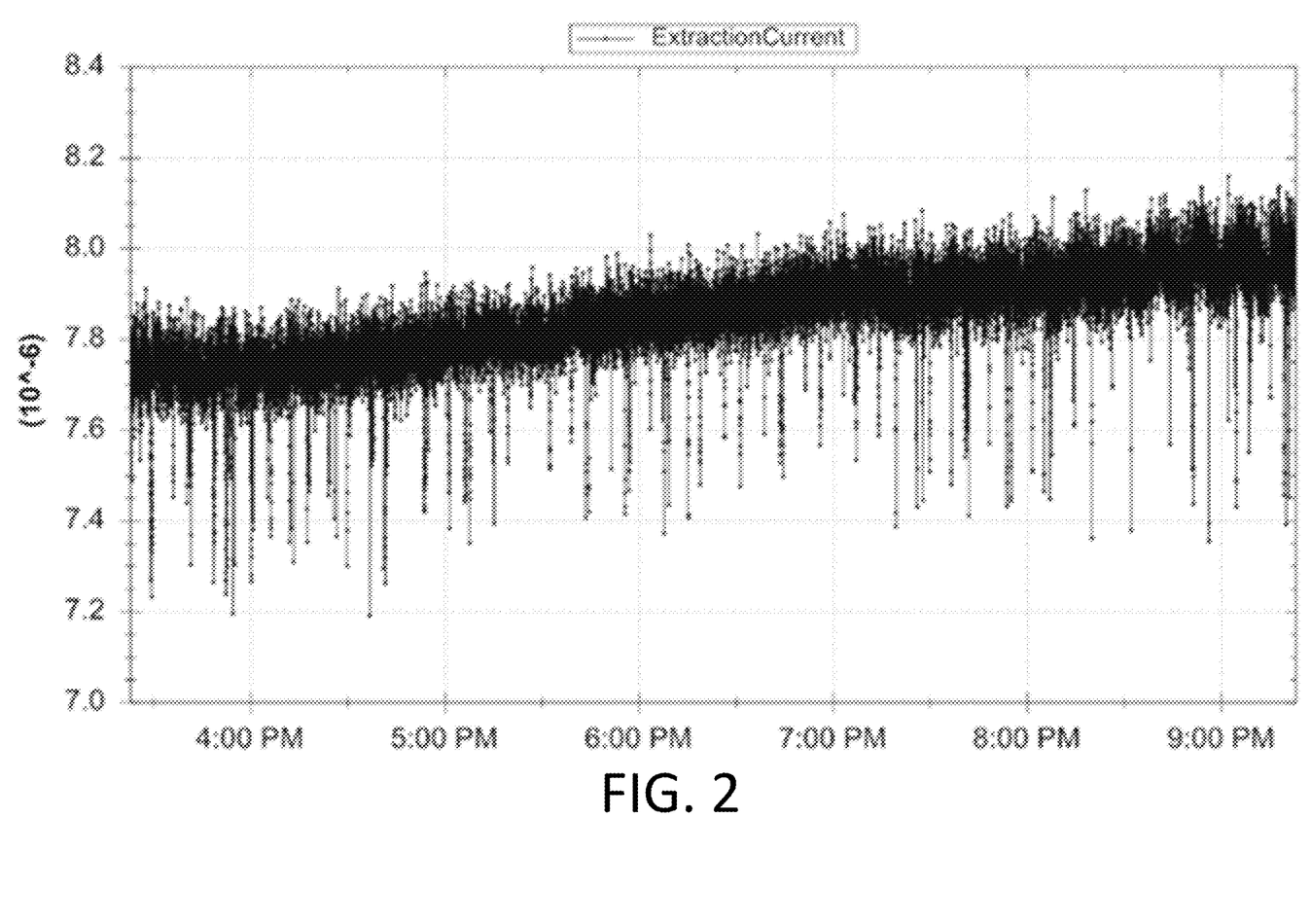
FIG. 2 shows test results of stability of a Pt/CsKTe/Ni photocathode.

FIG. 2 shows test results of stability of a Pt/CsKTe/Ni photocathode. Extraction current is plotted over an approximately six hour period. The majority of noise seen in FIG. 2 is caused by the laser. FIG. 2 demonstrates that a photocathode with a protective film, such as the protective film 102, will have higher stability and lifetime.

Figure 6:
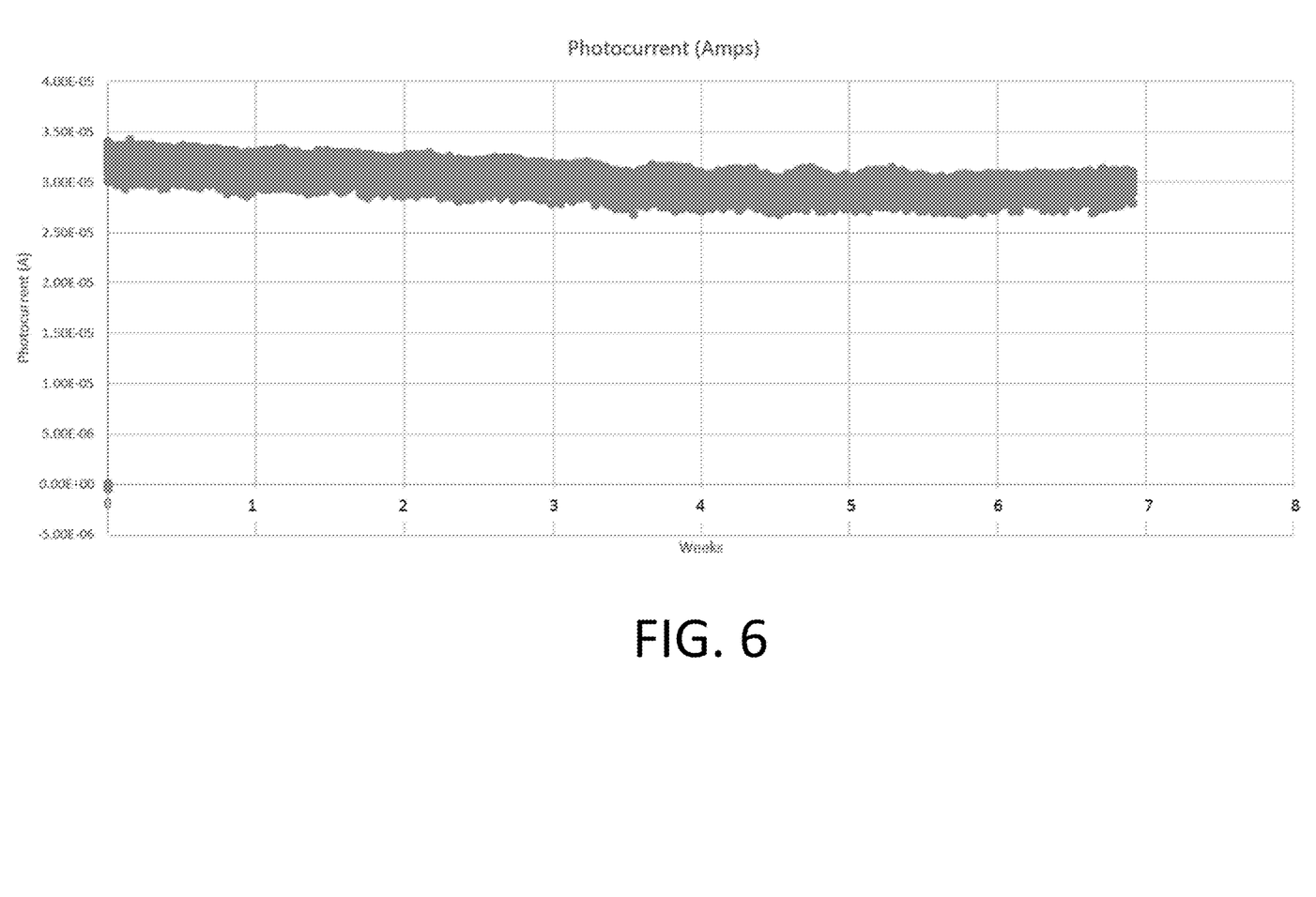
FIG. 6 shows test results for photocurrent.

FIG. 6 shows test results for photocurrent for the photocathode of FIG. 2. FIG. 6 demonstrates that photocurrent is relatively stable over long periods of operation, which is an improvement over previous designs.

Figure 3:
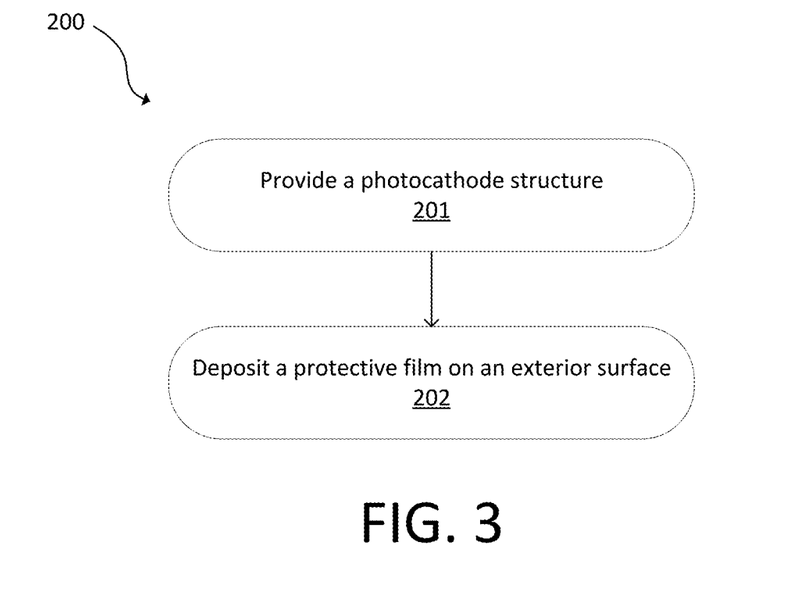
FIG. 3 is a flowchart of a method embodiment in accordance with the present disclosure.

FIG. 3 is a flowchart of a method 200. A photocathode structure that includes one or more of $Cs_2Te$, CsKTe, CsI, CsBr, GaAs, GaN, InSb, CsKSb, or a metal is provided at 201. In an instance, the photocathode includes $Cs_2Te$ or CsKTe. A protective film is deposited on an exterior surface of the photocathode structure at 202. The protective film includes one or more of ruthenium, nickel, platinum, chromium, copper, gold, silver, aluminum, or an alloy thereof. In an instance, the protective film includes one or more of ruthenium, nickel, platinum, chromium, or copper. The protective film may be an embodiment of the protective film 102. The deposition can include ion sputtering, magnetron sputtering, or ALD. The deposition can provide the desired film density, conformal nature, and amount of pinhole defects.

Figure 4:
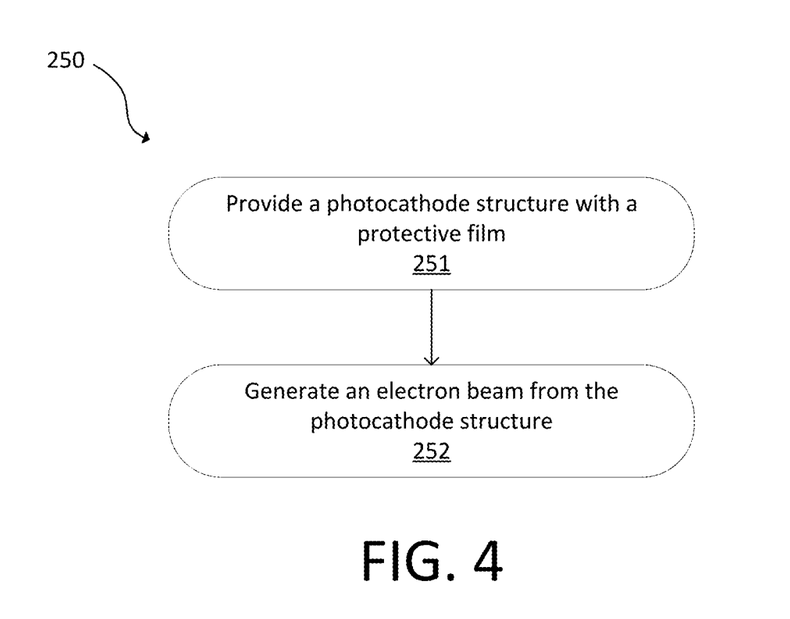
FIG. 4 is a flowchart of another method embodiment in accordance with the present disclosure.

FIG. 4 is a flowchart of a method 250. A photocathode structure is provided at 251. The photocathode structure includes one or more of $Cs_2Te$, CsKTe, CsI, CsBr, GaAs, GaN, InSb, CsKSb, or a metal. The photocathode structure also includes a protective film disposed on an exterior surface of the photocathode structure. The protective film includes one or more of ruthenium, nickel, platinum, chromium, copper, gold, silver, aluminum, or an alloy thereof. In an instance, the photocathode structure includes $Cs_2Te$ or CsKTe and the protective film includes one or more of ruthenium, nickel, platinum, chromium, or copper. The protective film may be an embodiment of the protective film 102. An electron beam is generated from the photocathode structure at 252 when photons are directed at the photocathode structure. Electron generation may occur at approximately $10^{-5}$ Torr or less, such as $10^{-9}$ Torr. The electron beam can be generated in transmission or reflection mode.

A plasma clean can optionally be performed on the photocathode structure after the electron beam is generated. Oxidation and carbon can be removed from surfaces with the plasma clean. A plasma clean can clean to an atomic level using molecular hydrogen, hydrogen plasma, or other plasmas.

Figure 5:
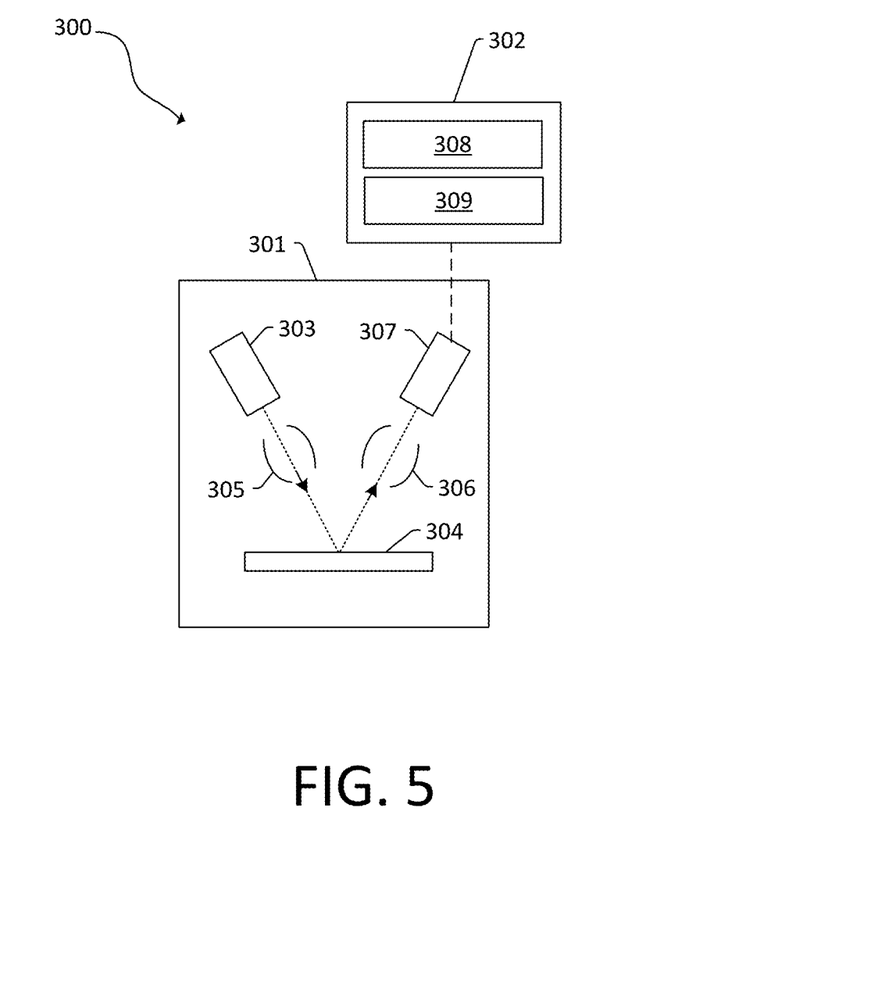
FIG. 5 is a block diagram of an embodiment of a system in accordance with the present disclosure.

FIG. 5 is a block diagram of an embodiment of a system 300. The system 300 includes a wafer inspection tool (which includes the electron column 301) configured to generate images of a wafer 304.

The wafer inspection tool includes an output acquisition subsystem that includes at least an energy source and a detector. The output acquisition subsystem may be an electron beam-based output acquisition subsystem. For example, in one embodiment, the energy directed to the wafer 304 includes electrons, and the energy detected from the wafer 304 includes electrons. In this manner, the energy source may be an electron beam source. In one such embodiment shown in FIG. 5, the output acquisition subsystem includes electron column 301, which is coupled to computer subsystem 302. A chuck (not illustrated) may hold the wafer 304.

As also shown in FIG. 5, the electron column 301 includes an electron beam source 303 configured to generate electrons that are focused to wafer 304 by one or more elements 305. The electron beam source 303 may include, for example, an embodiment of the electron source 100 of FIG. 1. The one or more elements 305 may include, for example, a gun lens, an anode, a beam limiting aperture, a gate valve, a beam current selection aperture, an objective lens, and a scanning subsystem, all of which may include any such suitable elements known in the art.

Electrons returned from the wafer 304 (e.g., secondary electrons) may be focused by one or more elements 306 to detector 307. One or more elements 306 may include, for example, a scanning subsystem, which may be the same scanning subsystem included in element(s) 305.

The electron column also may include any other suitable elements known in the art.

Although the electron column 301 is shown in FIG. 5 as being configured such that the electrons are directed to the wafer 304 at an oblique angle of incidence and are scattered from the wafer 304 at another oblique angle, the electron beam may be directed to and scattered from the wafer 304 at any suitable angles. In addition, the electron beam-based output acquisition subsystem may be configured to use multiple modes to generate images of the wafer 304 (e.g., with different illumination angles, collection angles, etc.). The multiple modes of the electron beam-based output acquisition subsystem may be different in any image generation parameters of the output acquisition subsystem.

Computer subsystem 302 may be coupled to detector 307 such that the computer subsystem 302 is in electronic communication with the detector 307 or other components of the wafer inspection tool. The detector 307 may detect electrons returned from the surface of the wafer 304 thereby forming electron beam images of the wafer 304 with the computer subsystem 302. The electron beam images may include any suitable electron beam images. The computer subsystem 302 includes a processor 308 and an electronic data storage unit 309. The processor 308 may include a microprocessor, a microcontroller, or other devices.

It is noted that FIG. 5 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The computer subsystem 302 may be coupled to the components of the system 300 in any suitable manner (e.g., via one or more transmission media, which may include wired and/or wireless transmission media) such that the processor 308 can receive output. The processor 308 may be configured to perform a number of functions using the output. The wafer inspection tool can receive instructions or other information from the processor 308. The processor 308 and/or the electronic data storage unit 309 optionally may be in electronic communication with another wafer inspection tool, a wafer metrology tool, or a wafer review tool (not illustrated) to receive additional information or send instructions.

The computer subsystem 302, other system(s), or other subsystem(s) described herein may be part of various systems, including a personal computer system, image computer, mainframe computer system, workstation, network appliance, interne appliance, or other device. The subsystem(s) or system(s) may also include any suitable processor known in the art, such as a parallel processor. In addition, the subsystem(s) or system(s) may include a platform with high speed processing and software, either as a standalone or a networked tool.

The processor 308 and electronic data storage unit 309 may be disposed in or otherwise part of the system 300 or another device. In an example, the processor 308 and electronic data storage unit 309 may be part of a standalone control unit or in a centralized quality control unit. Multiple processors 308 or electronic data storage unit 309 may be used.

The processor 308 may be implemented in practice by any combination of hardware, software, and firmware. Also, its functions as described herein may be performed by one unit, or divided up among different components, each of which may be implemented in turn by any combination of hardware, software, and firmware. Program code or instructions for the processor 308 to implement various methods and functions may be stored in readable storage media, such as a memory in the electronic data storage unit 309 or other memory.

The system 300 of FIG. 5 is merely one example of a system that can use embodiments of the electron source 100 or embodiments of the method 250. Embodiments of the electron source 100 may be part of a defect review system, an inspection system, a metrology system, or some other type of system. Thus, the embodiments disclosed herein describe some configurations that can be tailored in a number of manners for systems having different capabilities that are more or less suitable for different applications.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An electron emitter comprising:
a photocathode structure that includes one or more of $Cs_2Te$, CsKTe, CsI, CsBr, GaAs, GaN, InSb, CsKSb, or a metal;
a substrate;
a protective film disposed on an exterior surface of the photocathode structure opposite the substrate, wherein the protective film includes one or more of ruthenium, nickel, platinum, chromium, copper, gold, silver, aluminum, or an alloy thereof; and
a second protective film between the substrate and the photocathode structure, wherein the second protective film includes one or more of ruthenium, nickel, platinum, chromium, copper, gold, silver, aluminum, or an alloy thereof.

2. The electron emitter of claim 1, wherein the substrate is one or more of quartz, sapphire, UV fused silica, $CaF_2$, or $MgF_2$.

3. The electron emitter of claim 1, wherein the protective film encapsulates the photocathode structure and is disposed between the photocathode structure and the substrate to form the second protective film, and wherein the substrate is one or more of quartz, sapphire, UV fused silica, $CaF_2$, or $MgF_2$.

4. The electron emitter of claim 3, further comprising a voltage source that applies a voltage to the protective film.

5. The electron emitter of claim 1, wherein the photocathode structure includes $Cs_2Te$ or CsKTe and the protective film includes one or more of ruthenium, nickel, or platinum.

6. The electron emitter of claim 1, wherein the protective film includes nickel.

7. The electron emitter of claim 1, wherein the photocathode structure is configured to operate in transmission or reflection mode.

8. The electron emitter of claim 1, further comprising a voltage source that applies a voltage to the protective film.

9. The electron emitter of claim 1, wherein the protective film is transparent to UV wavelengths.

10. The electron emitter of claim 1, wherein the protective film has a thickness from 1 nm to 10 nm.

11. The electron emitter of claim 1, wherein the protective film has a porosity less than or equal to 25%.

12. The electron emitter of claim 1, wherein the protective film has a packing density of greater than or equal to 0.92.

13. An electron beam tool including the electron emitter of claim 1, wherein the electron beam tool includes a detector that receives electrons generated by the electron emitter and reflected from a surface of a wafer.

14. A method comprising:
providing a substrate and a photocathode structure that includes one or more of $Cs_2Te$, CsKTe, CsI, CsBr, GaAs, GaN, InSb, CsKSb, or a metal;
depositing a protective film on an exterior surface of the photocathode structure opposite the substrate, wherein the protective film includes one or more of ruthenium, nickel, platinum, chromium, copper, gold, silver, aluminum, or an alloy thereof.

15. The method of claim 14, wherein the depositing includes ion sputtering, magnetron sputtering, or atomic layer deposition.

16. A method comprising:
   providing an electron emitter comprising:
      a photocathode structure including one or more of $Cs_2Te$, CsKTe, CsI, CsBr, GaAs, GaN, InSb, CsKSb, or a metal;
      a substrate;
      a protective film disposed on an exterior surface of the photocathode structure opposite the substrate, wherein the protective film includes one or more of ruthenium, nickel, platinum, chromium, copper, gold, silver, aluminum, or an alloy thereof; and
      a second protective film between the substrate and the photocathode structure, wherein the second protective film includes one or more of ruthenium, nickel, platinum, chromium, copper, gold, silver, aluminum, or an alloy thereof; and
   generating an electron beam from the photocathode structure when photons are directed at the photocathode structure.

17. The method of claim 16, further comprising performing a plasma clean of the photocathode structure.

18. The method of claim 16, wherein the photocathode structure generates the electron beam in transmission mode.

19. The method of claim 16, wherein the photocathode structure generates the electron beam in reflection mode.

* * * * *